United States Patent
Byun

(10) Patent No.: US 9,412,846 B2
(45) Date of Patent: Aug. 9, 2016

(54) THIN-FILM TRANSISTOR, METHOD OF MANUFACTURING THE SAME, AND ORGANIC LIGHT-EMITTING DIODE (OLED) DISPLAY INCLUDING THE SAME

(71) Applicant: Samsung Display Co. Ltd., Yongin, Gyeonggi-Do (KR)

(72) Inventor: Ki Yeol Byun, Seoul (KR)

(73) Assignee: Samsung Display Co., Ltd., Gyeonggi-Do (KR)

( * ) Notice: Subject to any disclaimer, the term of this patent is extended or adjusted under 35 U.S.C. 154(b) by 20 days.

(21) Appl. No.: 14/527,609

(22) Filed: Oct. 29, 2014

(65) Prior Publication Data

US 2015/0129854 A1 May 14, 2015

(30) Foreign Application Priority Data

Nov. 14, 2013 (KR) ........................ 10-2013-0138492

(51) Int. Cl.
| | |
|---|---|
| *H01L 27/14* | (2006.01) |
| *H01L 29/66* | (2006.01) |
| *H01L 21/265* | (2006.01) |
| *H01L 29/423* | (2006.01) |
| *H01L 29/786* | (2006.01) |
| *H01L 27/32* | (2006.01) |

(52) U.S. Cl.
CPC .... *H01L 29/66757* (2013.01); *H01L 21/26513* (2013.01); *H01L 29/42384* (2013.01); *H01L 29/78675* (2013.01); *H01L 27/3262* (2013.01); *H01L 29/7869* (2013.01)

(58) Field of Classification Search
None
See application file for complete search history.

(56) References Cited

U.S. PATENT DOCUMENTS

| | | | |
|---|---|---|---|
| 6,746,905 B1 | 6/2004 | Fukuda | |
| 6,835,662 B1 * | 12/2004 | Erhardt et al. | ............... 438/689 |
| 7,413,940 B2 | 8/2008 | Lin | |
| 7,700,495 B2 * | 4/2010 | Doi et al. | ....................... 438/733 |
| 2011/0031500 A1 * | 2/2011 | Suh | ................................. 257/59 |
| 2012/0146031 A1 * | 6/2012 | Lee | ................................. 257/59 |
| 2012/0326157 A1 | 12/2012 | Park et al. | |

FOREIGN PATENT DOCUMENTS

| | | |
|---|---|---|
| JP | 2002-164543 A | 6/2002 |
| JP | 2006-344905 A | 12/2006 |
| JP | 2010-287857 A | 12/2010 |
| KR | 10-2008-0054349 A | 6/2008 |
| KR | 10-0922792 A | 10/2009 |

* cited by examiner

*Primary Examiner* — Reema Patel

(74) *Attorney, Agent, or Firm* — Knobbe, Martens, Olson & Bear, LLP

(57) ABSTRACT

A thin-film transistor, method of manufacturing the same, and organic light-emitting diode (OLED) display including the same are disclosed. In one aspect, the thin-film transistor includes an active layer including a channel region, a source region, and a drain region, wherein the active layer has a top surface. The transistor also includes a gate insulating layer formed over the active layer and a gate metal layer formed over the gate insulating layer and having a bottom surface. The area of the bottom surface of the gate metal layer is less than the area of the top surface of the active layer and the bottom surface of the gate metal layer overlaps the top surface of the active layer.

18 Claims, 24 Drawing Sheets

FIG. 5
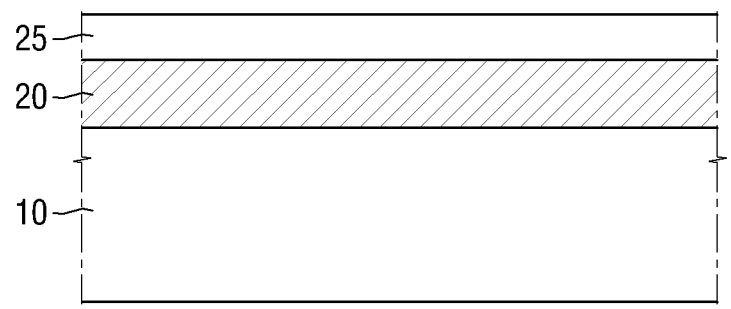
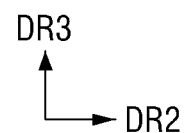

US 9,412,846 B2

THIN-FILM TRANSISTOR, METHOD OF MANUFACTURING THE SAME, AND ORGANIC LIGHT-EMITTING DIODE (OLED) DISPLAY INCLUDING THE SAME

CROSS-REFERENCE TO RELATED APPLICATIONS

This application claims priority from Korean Patent Application No. 10-2013-0138492 filed on Nov. 14, 2013 in the Korean Intellectual Property Office, the disclosure of which is incorporated herein by reference in its entirety.

BACKGROUND

1. Field

The described technology generally relates to a thin-film transistor, a method of manufacturing the same, and an organic light-emitting diode (OLED) display including the same.

2. Description of the Related Technology

Thin-film transistors (TFTs) are used to control the electric current flowing through a thin-film semiconductor by applying an electric field to a channel region of the semiconductor. The electric field is applied via a gate electrode in a direction perpendicular to the direction of the electric current flow. Thin-film transistors are an example of a field effect transistor.

TFTs formed of polycrystalline silicon are referred to as low-temperature polycrystalline silicon (LTPS) thin-film transistors. The edge structure of an LTPS TFT refers to the edges formed along the width of the channel region of the TFT and can be formed by an active layer patterning process. The edge structure determines the distribution of the electric field during operation of the LTPS TFT. In particular, when the electric field is concentrated along the edges in the width direction of the channel region, charge carrier injection (injection of electrons or holes) increases.

SUMMARY OF CERTAIN INVENTIVE ASPECTS

One inventive aspect is a thin-film transistor which can minimize the effect of an electric field due to the edge structure of an active layer.

Another aspect is an organic light-emitting diode (OLED) display including a thin-film transistor which can minimize the effect of an electric field due to the edge structure of an active layer.

Another aspect is a method of manufacturing a thin-film transistor which can minimize the effect of an electric field due to the edge structure of an active layer.

However, aspects of the described technology are not restricted to those set forth herein. The above and other aspects of the described technology will become more apparent to one of ordinary skill in the art to which the described technology pertains by referencing the detailed description given below.

Another aspect is a thin-film transistor including an active layer which is formed on a substrate and has a channel region, a source region and a drain region arranged in a lengthwise direction, a gate insulating layer which is formed on the active layer and a gate metal layer which is formed on the gate insulating layer, wherein the total area of the gate metal layer is within a range that allows the gate metal layer to perpendicularly overlap the active layer.

Another aspect is an organic light-emitting diode (OLED) display including the above mentioned thin-film transistor.

Another aspect is a method of manufacturing a thin-film transistor, the method including forming an active layer, which has a channel region, a source region and a drain region arranged in a lengthwise direction, on a substrate, sequentially stacking a gate insulating layer, a gate metal layer, and a hard mask pattern on the active layer and sequentially etching the gate metal layer and the gate insulating layer using the hard mask pattern as a mask, wherein the total area of the gate metal layer is within a range that allows the gate metal layer to perpendicularly overlap the active layer.

Another aspect is an OLED display including a substrate, a plurality of OLEDs formed over the substrate, and a plurality of thin-film transistors formed over the substrate and respectively connected to the OLEDs, wherein each of the thin-film transistors includes an active layer formed over the substrate and having a top surface, a gate insulating layer formed over the active layer, and a gate electrode formed over the gate insulating layer and having a bottom surface, wherein the width of the gate electrode is less than that of the active layer, and wherein the bottom surface of the gate electrode overlaps the top surface of the active layer.

Each of the active layer, the gate insulating layer, and the gate electrode includes a bottom surface and sidewalls defining a taper angle therebetween and the taper angles of each of the active layer, the gate insulating layer, and the gate electrode are substantially equal.

The taper angles of each of the active layer, the gate insulating layer, and the gate electrode are acute angles. The sidewalls of each of the active layer, the gate insulating layer, and the gate electrode are substantially parallel.

BRIEF DESCRIPTION OF THE DRAWINGS

FIGS. 5 through 15 are views illustrating steps of a method of manufacturing the thin-film transistor of FIG. 2.

DETAILED DESCRIPTION OF CERTAIN INVENTIVE EMBODIMENTS

Figure 1:
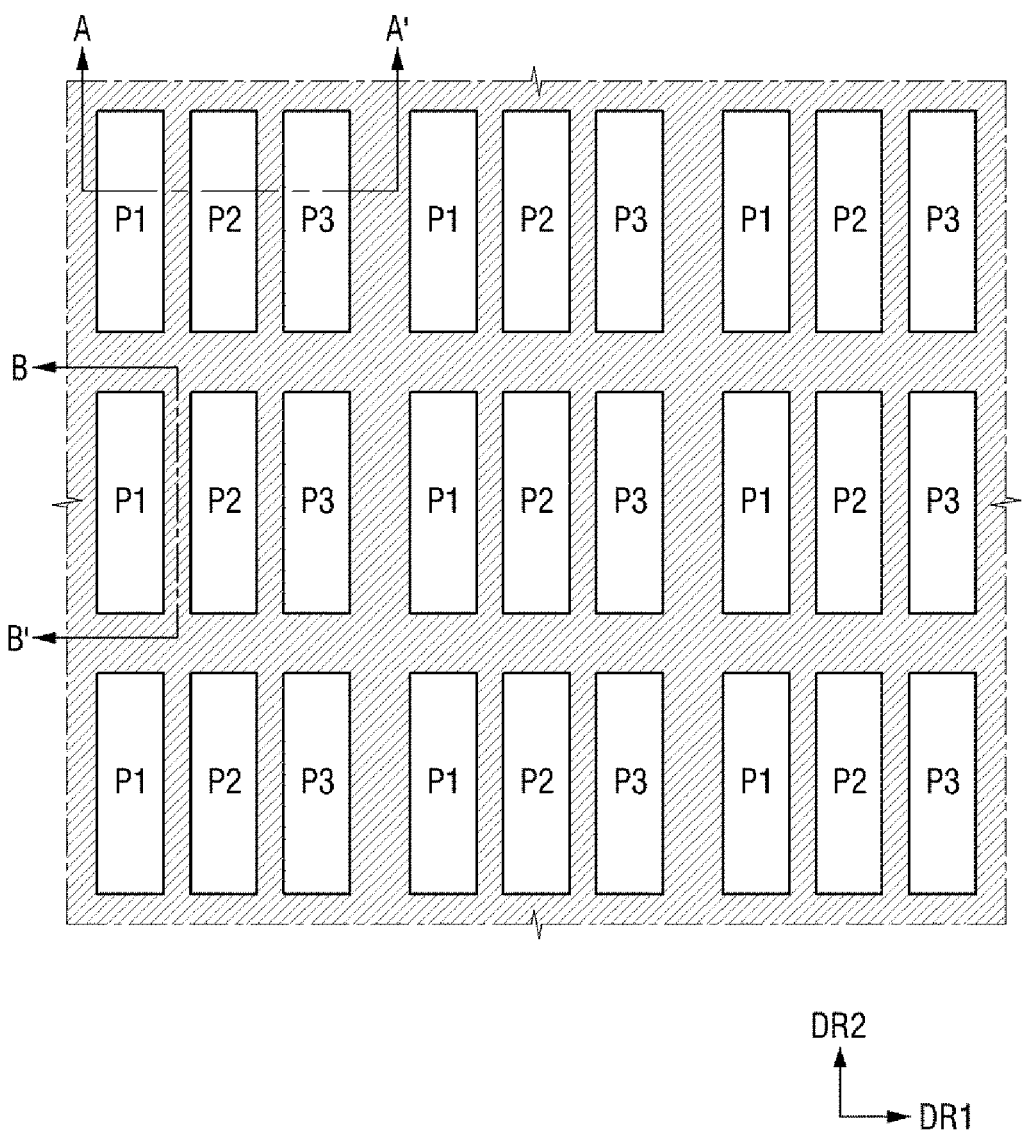
FIG. 1 is a plan view of an organic light-emitting diode (OLED) display according to an embodiment.

Advantages and features of the described technology and methods of accomplishing the same may be understood more readily by reference to the following detailed description of preferred embodiments and the accompanying drawings. The described technology may, however, be embodied in many different forms and should not be construed as being limited to the embodiments set forth herein. Rather, these embodiments are provided so that this disclosure will be thorough and complete and will fully convey the concept of the described technology to those skilled in the art, and the described technology will only be defined by the appended claims. Thus, in some embodiments, well-known structures and devices are not shown in order not to obscure the description of the described technology with unnecessary detail. Like numbers refer to like elements throughout. In the drawings, the thicknesses of layers and regions may be exaggerated for clarity.

It will be understood that when an element or layer is referred to as being "on," or "connected to" another element or layer, it can be directly on or connected to the other element or layer or intervening elements or layers may also be present. In contrast, when an element is referred to as being "directly on" or "directly connected to" another element or layer, there are no intervening elements or layers present. As used herein, the term "and/or" includes any and all combinations of one or more of the associated listed items.

Spatially relative terms, such as "below," "beneath," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures.

Embodiments described herein will be described referring to plan views and/or cross-sectional views by way of ideal schematic views of the described technology. Accordingly, the exemplary views may be modified depending on manufacturing technologies and/or tolerances. Therefore, the embodiments of the described technology are not limited to those shown in the views, but include modifications in configuration formed on the basis of manufacturing processes. Therefore, regions exemplified in figures have schematic properties and shapes of regions shown in figures exemplify specific shapes of regions of elements and do not limit aspects of the described technology.

Hereinafter, embodiments of the described technology will be described with reference to the attached drawings.

FIG. 1 is a plan view of an organic light-emitting diode (OLED) display 1 according to an embodiment.

Referring to FIG. 1, the OLED display 1 includes a plurality of pixels P1 through P3. Each of the pixels P1 through P3 can emit light. The OLED display 1 displays a desired image by controlling the luminance of light emitted from each of the pixels P1 through P3. The pixels P1 through P3 may be arranged in a matrix, but the arrangement of the pixels P1 through P3 is not limited to a matrix.

The pixels P1 through P3 may include first pixels P1, second pixels P2 and third pixels P3. Each of the first to third pixels P1 to P3 may emit light of different colors. For example, the first pixels P1 may emit red light, the second pixels P2 may emit green light, and the third pixels P3 may emit blue light. However, the described technology is not limited thereto. One first pixel P1, one second pixel P2, and one third pixel P3 which are adjacent to one another may function as a unit for displaying an image on the OLED display 1.

Figure 2:
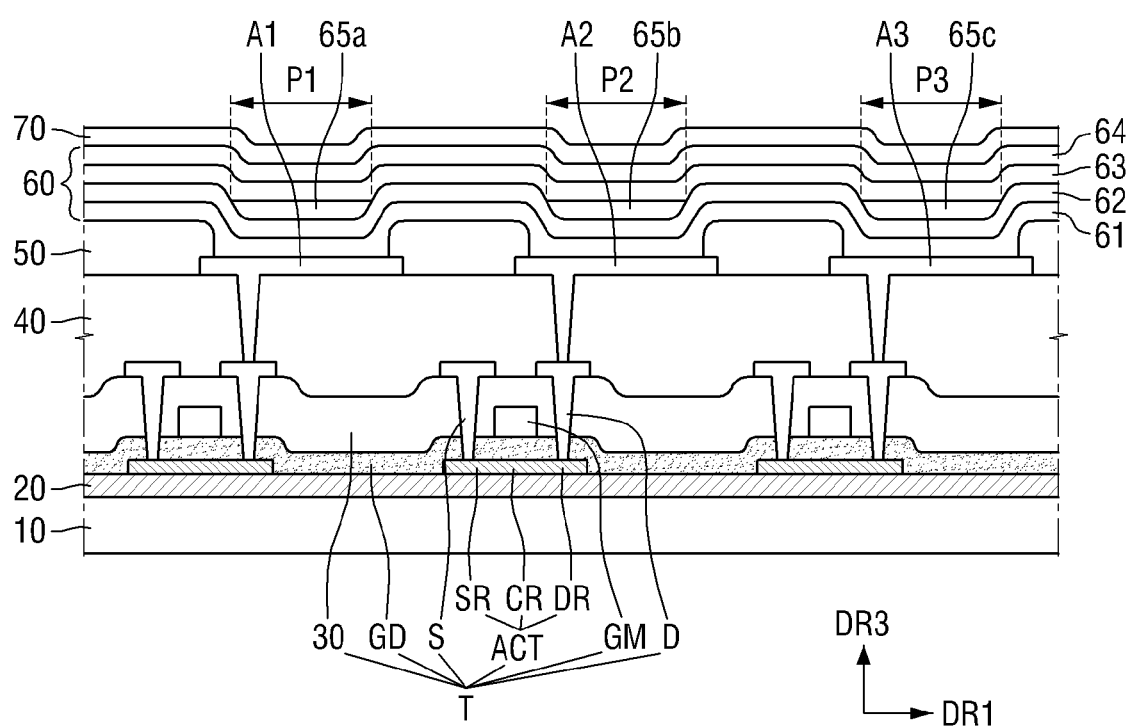
FIG. 2 is a cross-sectional view of the OLED display taken along the line A-A' of FIG. 1.

The OLED display 1 will now be described in more detail with reference to FIG. 2. FIG. 2 is a cross-sectional view of the OLED display 1 taken along the line A-A' of FIG. 1.

Referring to FIG. 2, the OLED display 1 includes a substrate 10, a plurality of anodes A1 through A3, an organic layer 60, and a cathode 70.

The substrate 10 may be plate-shaped and support structures formed on the substrate 10. The substrate 10 may be formed of an insulating material such as, but not limited to, glass, polyethylene terephthalate (PET), polycarbonate (PC), polyethersulfone (PES), polyimide (PI) or polymethylmethacrylate (PMMA). According to some embodiments, the substrate 10 is formed of a flexible material.

The anodes A1 through A3 are formed on the substrate 10. Each of the anodes A1 through A3 is connected to a thin-film transistor T which will be described later. An electric current flowing through the organic layer 60 may be controlled by a signal transmitted from the thin-film transistor T. The anodes A1 through A3 may be formed of a reflective conductive material. The anodes A1 through A3 may have a structure composed of, but not limited to, silver (Ag)/indium tin oxide (ITO), ITO/Ag/ITO, molybdenum (Mo)/ITO, aluminum (A1)/ITO, or titanium (Ti)/ITO. The anodes A1 through A3 formed of a reflective conductive material may reflect light generated from the organic layer 60 in an upward direction.

The anodes A1 through A3 include a first anode A1, a second anode A2, and a third anode A3. The first anode A1 is formed in a first pixel P1, the second anode A2 is formed in a second pixel P2, and the third anode A3 is formed in a third pixel P3.

The organic layer 60 is formed on the anodes A1 through A3. The organic layer 60 emits light at a luminance level corresponding to an electric current flowing between the anodes A1 through A3 and the cathode 70.

In addition, the illustrated organic layer 60 includes a hole injection layer 61, a hole transport layer 62, an electron transport layer 63, an electron injection layer 64, and organic light-emitting layers 65a through 65c.

The hole injection layer 61 is formed on the anodes A1 through A3. When an electric field is applied between the anodes A1 through A3 and the cathode 70, the hole injection layer 61 helps holes to be easily injected into the organic light-emitting layers 65a through 65c.

The hole transport layer 62 is formed on the hole injection layer 61. Holes from the hole injection layer 61 may be transported to the organic light-emitting layers 65a through 65c via the hole transport layer 62.

The electron transport layer 63 is formed on the hole transport layer 62. Electrons from the electron injection layer 64 are transported to the organic light-emitting layers 65a through 65c via the electron transport layer 63.

The electron injection layer 64 is formed on the electron transport layer 63. When an electric field is applied between the anodes A1 through A3 and the cathode 70, the electron transport layer 63 may help electrons to be easily injected into the organic light-emitting layers 65a through 65c.

According to some embodiments, one or more of the hole injection layer 61, the hole transport layer 62, the electron transport layer 63, or the electron injection layer 64 may be omitted. In addition, the organic layer 60 may include only one of the hole injection layer 61, the hole transport layer 62, the electron transport layer 63, or the electron injection layer 64.

The organic light-emitting layers 65a through 65c are formed between the hole transport layer 62 and the electron transport layer 63. In response to an electric field applied between the anodes A1 through A3 and the cathode 70, the organic light-emitting layers 65a through 65c emit light at a luminance level corresponding to the magnitude of the electric current flowing therethrough. The organic light-emitting layers 65a through 65c emit light corresponding to energy generated by a change in an energy level of excitons that are formed when holes and electrons recombine. The organic light-emitting layers 65a through 65c may be formed on the anodes A1 through A3 by a deposition or printing method using a mask. The organic light-emitting layers 65a through 65c may include a first organic light-emitting layer 65a, a second organic light-emitting layer 65b, and a third organic light-emitting layer 65c. The first organic light-emitting layer 65a is formed on the first anode A1 and, e.g., emits red light. The second organic light-emitting layer 65b is formed on the second anode A2 and, e.g., emits green light. The third organic light-emitting layer 65c is formed on the third anode A3 and, e.g., emits blue light.

The cathode 70 is formed on the organic layer 60. The cathode 70 may be formed of an optically transparent or semi-transparent conductive material. According to some embodiments, the cathode 70 is formed of, but not limited to, ITO, indium zinc oxide (IZO), a compound of magnesium (Mg) and Ag, a compound of calcium (Ca) and Ag, or a compound of lithium (Li) and Al. Light generated by the organic layer 60 may be emitted to the environment through the cathode 70. To improve light transmittance of the cathode 70, the cathode 70 may be formed to have a thin profile. For example, the cathode 70 may be formed to a thickness of about 200 Å or less.

The material that forms the cathode 70 may have relatively higher resistivity than typical metals. In addition, since the cathode 70 can be formed as a thin layer, the voltage applied to the cathode 70 may be dropped due to the resistivity of the cathode 70. Therefore, the cathode 70 may have a different voltage value in each of the pixels P1 through P3. Accordingly, this may cause the formation of luminance stains on the OLED display 1.

The OLED display 1 may further include a buffer layer 20, the thin-film transistor T, a planarization layer 40, and a pixel defining layer 50.

The buffer layer 20 is formed on a top surface of the substrate 10. The buffer layer 20 may prevent penetration of impurity elements and planarize the top surface of the substrate 10. The buffer layer 20 may be formed of various materials that can perform the above functions. For example, the buffer layer 20 may be formed of any one of a silicon nitride ($SiN_x$) layer, a silicon oxide ($SiO_2$) layer, or a silicon oxynitride ($SiO_xN_y$) layer. According to some embodiments, the buffer layer 20 is omitted.

The thin-film transistor T includes an active layer ACT, a gate insulating layer GD, a gate metal layer or gate electrode GM, a source electrode S, a drain electrode D, and an interlayer insulating layer 30.

The active layer ACT is formed on the substrate 10.

Specifically, the active layer ACT may be disposed on the buffer layer 20. The active layer ACT may include a polysilicon layer, but it is not limited thereto. The active layer ACT includes a channel region CR, a source region SR, and a drain region DR arranged in a first direction DR1. The source and drain regions SR and DR are formed on opposing sides of the channel region CR and respectively contact the source electrode S and the drain electrode D. In a method of manufacturing the thin-film transistor T which will be described later, impurities used to dope the active layer ACT may be P-type impurities including boron (B), such as $B_2H_6$. The type of impurities used to dope the active layer ACT may vary depending on the embodiment. According to some embodiments, the active layer ACT may also be replaced by an oxide semiconductor layer.

The gate insulating layer GD is formed on the active layer ACT. The gate insulating layer GD insulates the gate electrode GM, which will be formed later, and the active layer ACT from each other and covers the active layer ACT. The gate insulating layer GD may be formed of silicon nitride ($SiN_x$) or silicon oxide ($SiO_2$). In addition, the gate insulating layer GD may be formed within a range that overlaps the active layer ACT, but the described technology is not limited thereto. Namely, the gate insulating layer GD can have a width formed such that it is within the width of the active layer ACT.

The gate electrode GM is formed on the gate insulating layer GD. The gate electrode GM is formed within a range that overlaps the active layer ACT, i.e. the area of the gate electrode GM may be formed within the area of the active layer ACT. A voltage applied to the gate electrode GM controls the active layer ACT to have conductivity or non-conductivity. For example, if a relatively high voltage is applied to the gate electrode GM, the active layer ACT may have conductivity, thereby electrically connecting the drain electrode D and the source electrode S to each other. If a relatively low voltage is applied to the gate electrode GM, the active layer ACT may have non-conductivity, thereby insulating the drain electrode D and the source electrode S from each other.

The interlayer insulating layer 30 is formed on the substrate 10, the active layer ACT, the gate insulating layer GD, and the gate metal layer GM. The interlayer insulating layer 30 may cover the gate electrode GM and insulate the gate electrode GM from the source electrode S and the drain electrode D. The interlayer insulating layer 30 may be formed of $SiN_x$ or $SiO_2$.

The source electrode S and the drain electrode D are formed on the interlayer insulating layer 30. The source and drain electrodes S and D are separated from each other in the first direction DR1 and are respectively connected to the active layer ACT through first and second through holes which penetrate through the interlayer insulating layer 30 and the gate insulating layer GD. The first through hole is formed over the source region SR of the active layer ACT and the second through hole is formed over the drain region DR of the active layer ACT. The source and drain electrodes S and D are respectively formed in the first and second through holes.

Consequently, the thin-film transistor T may determine whether to provide a signal transmitted to the source electrode S to the drain electrode D based on a voltage applied to the gate electrode GM. As will be understood from the method of manufacturing the thin-film transistor T, the thin-film transistor T may further include a hard mask pattern 28b (see FIG. 10) on the gate metal layer GM. The hard mask pattern 28b may have a bottom surface and sidewalls that form substantially the same taper angle θ as a bottom surface and sidewalls of the gate metal layer GM in a plane defined by the second and third directions DR2 and DR3 (see FIG. 3).

The planarization layer 40 is formed on the thin-film transistor T and the interlayer insulating layer 30. To improve the emission efficiency of the organic layer 60 formed on the planarization layer 40, the planarization layer 40 is formed to have a flat top surface without a step. The planarization layer 40 may be formed of an insulating material. For example, the planarization layer 40 may be formed of one or more materials such as polyacrylates resin, epoxy resin, phenolic resin, polyamides resin, polyimides resin, unsaturated polyesters resin, poly phenylenethers resin, poly phenylenesulfides resin, or benzocyclobutene (BCB), but is not limited thereto. A contact hole is formed in the planarization layer 40. The contact hole exposes a top surface of the drain electrode D of the thin-film transistor T. The cathode 70 and the drain electrode D are connected to each other through the contact hole.

The pixel defining layer 50 is formed on the planarization layer 40. The pixel defining layer 50 may not completely cover the top surface of the planarization layer 40 and the pixel defining layer 50 exposes portions of the anodes A1 through A3. Regions respectively including the anodes A1 through A3 not covered by the pixel defining layer 50, the organic layer 60 formed on the anodes A1 through A3, and the cathode 70 may be defined as the pixels P1 through P3.

Figure 3:
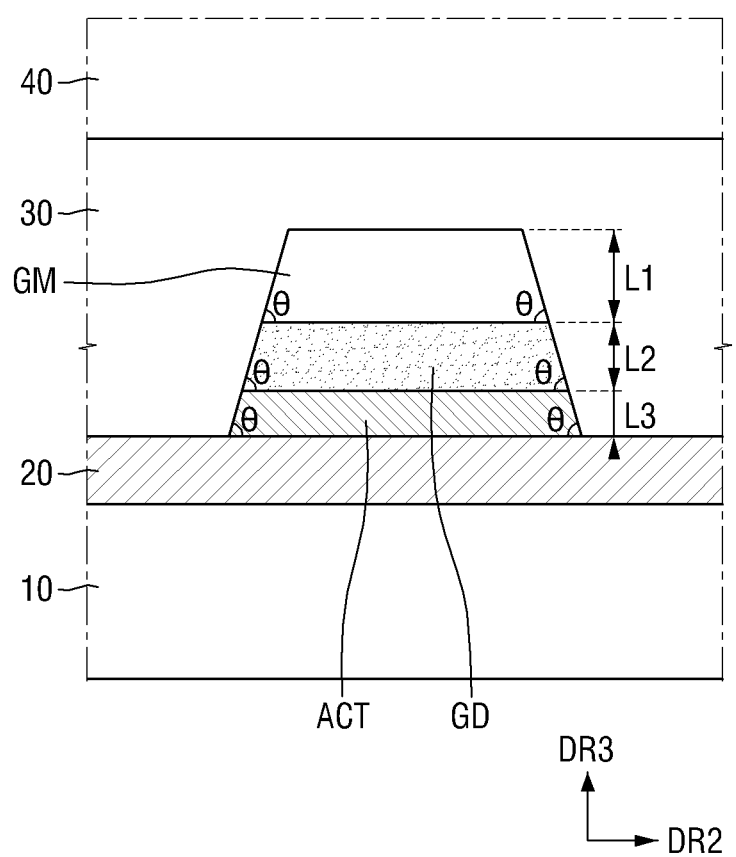
FIG. 3 is a cross-sectional view of the OLED display taken along the line B-B' of FIG. 1.

The thin-film transistor T included in the OLED display 1 will now be described in detail with reference to FIG. 3. FIG. 3 is a cross-sectional view of the OLED display 1 taken along the line B-B' of FIG. 1.

Referring to FIG. 3, the total area of the gate metal layer GM of the thin-film transistor T may be within a range that allows the gate metal layer GM to overlap the active layer ACT in a third direction DR3.

Specifically, the taper angle θ formed between the bottom surface and each sidewall of the gate metal layer GM is substantially equal to the taper angle θ formed between the bottom surface and each sidewall of the active layer ACT. The taper angle θ of the gate metal layer GM may be, but is not limited to, substantially equal to the taper angle θ of the gate insulating layer GD.

In addition, a first height L1 of the gate metal layer GM in the third direction DR3 is greater than a second height L2 of the gate insulating layer GD and a third height L3 of the active layer ACT in the third direction DR3.

The gate insulating layer GD may overlap the active layer ACT in the second direction DR2, but the described technology is not limited thereto. That is, the width of the gate insulating layer GD in the second direction DR2 may be within a range that allows the gate insulating layer GD to overlap the active layer ACT.

Specifically, the taper angle θ formed between the bottom surface and each sidewall of the gate insulating layer GD is substantially equal to the taper angle θ formed between the bottom surface and each sidewall of the active layer ACT. In addition, the second height L2 of the gate insulating layer GD in the third direction DR3 is greater than the third height L3 of the active layer ACT in the third direction DR3.

The interlayer insulating layer 30 is formed on the substrate 10, the active layer ACT, the gate insulating layer GD, and the gate metal layer GM.

Specifically, the interlayer insulating layer 30 is formed between the buffer layer 20 and the planarization layer 40 to cover the active layer ACT, the gate insulating layer GD, and the gate metal layer GM. In addition, the interlayer insulating layer 30 covers both sidewalls of the gate metal layer GM, both sidewalls of the gate insulating layer GD, and both sidewalls of the active layer ACT in the second direction DR2.

As described above, the gate insulating layer GD, the gate metal layer GM, and the active layer ACT may have substantially the same taper angle θ. This is because they are formed by an etching process performed using the hard mask pattern 28b (see FIG. 10) as a mask. In some embodiments, as illustrated in FIG. 3, when the taper angles of each of the gate insulating layer GD, the gate metal layer GM, and the active layer ACT are substantially the same, the sidewalls of each of the gate insulating layer GD, the gate metal layer GM, and the active layer ACT are substantially parallel.

The hard mask pattern 28b (see FIG. 10) may have a bottom surface and sidewalls that form substantially the same taper angle θ as the bottom surface and sidewalls of the gate metal layer GM. In addition, the area of the bottom surface of the hard mask pattern 28b (see FIG. 10) may be substantially equal to the area of the top surface of the gate metal layer GM. This will be described in detail later.

In the OLED display 1 according to the embodiment of FIGS. 2 and 3, the gate metal layer GM and the gate insulating layer GD substantially overlap the active layer ACT. Therefore, the effect of an electric field due to the edge structure of the active layer ACT in the second direction DR2 can be minimized. That is, since the gate metal layer GM and the gate insulating layer GD substantially overlap the active layer ACT, the interlayer insulating layer 30 can be formed on both sidewalls of the active layer ACT, both sidewalls of the gate insulating layer GD, and both sidewalls of the gate metal layer GM in the second direction DR2. Accordingly, the effect of an electric field on carriers concentrated in edge regions of the channel region CR of the active layer ACT in the second direction DR2 can be minimized. The minimized effect of the electric field on the carriers enables the carriers concentrated in the edge regions of the channel region CR in the second direction DR2 to be evenly distributed across the channel region CR of the active layer ACT in the second direction DR2.

Figure 4:
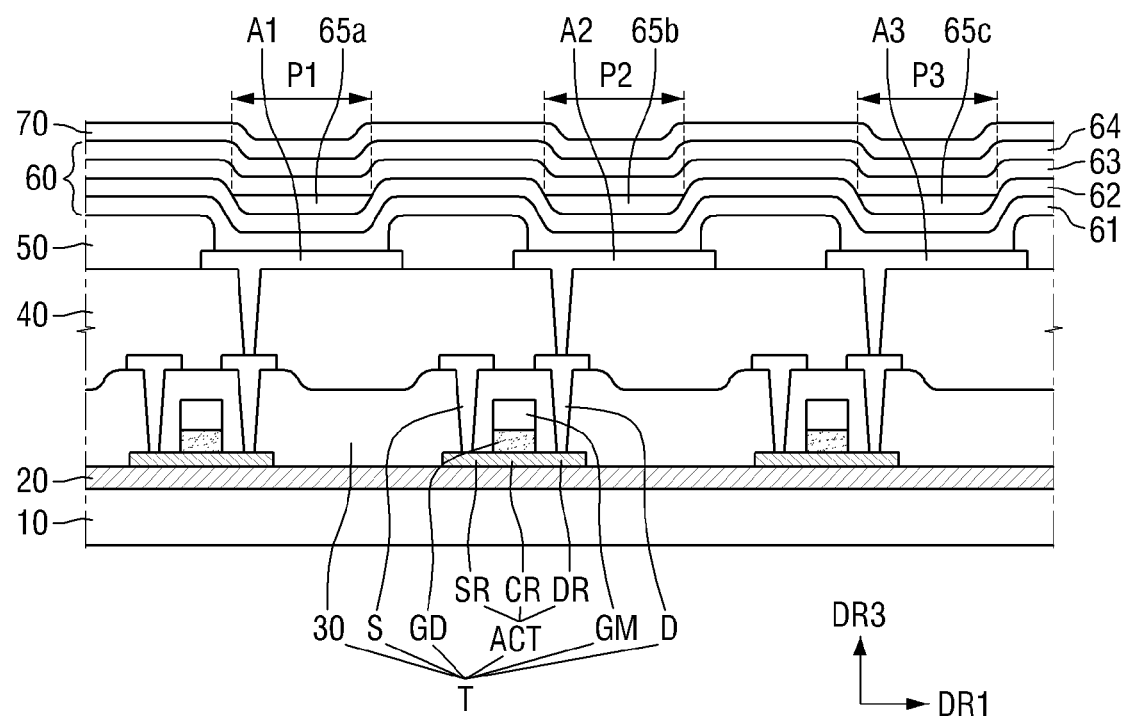
FIG. 4 is a cross-sectional view of an OLED display according to another embodiment.

An OLED display according to another embodiment will now be described with reference to FIG. 4. FIG. 4 is a cross-sectional view of an OLED display 2 according to another embodiment. The OLED display 2 of FIG. 4 will hereinafter be described, focusing mainly on the differences from the OLED display 1 of FIG. 2.

Referring to FIG. 4, a thin-film transistor T of the OLED display 2 of FIG. 4 is different from the thin-film transistor T of the OLED display 1 of FIG. 1 in the structure of the gate insulating layer GD.

That is, the gate insulating layer GD of FIG. 4 covers the channel region CR of an active layer ACT but exposes the source region SR and the drain region DR of the active layer ACT. Therefore, in a process of manufacturing the thin-film transistor TFT which will be described later, the thin-film transistor T of the OLED display 2 may be formed by etching a gate metal layer GM and then doping the exposed source and drain regions SR and DR with impurities.

A method of manufacturing the thin-film transistor T of FIG. 2 will now be described with reference to FIGS. 5 through 15. FIGS. 5 through 15 are views illustrating steps of a method of manufacturing the thin-film transistor T of FIG. 2.

Figure 6:
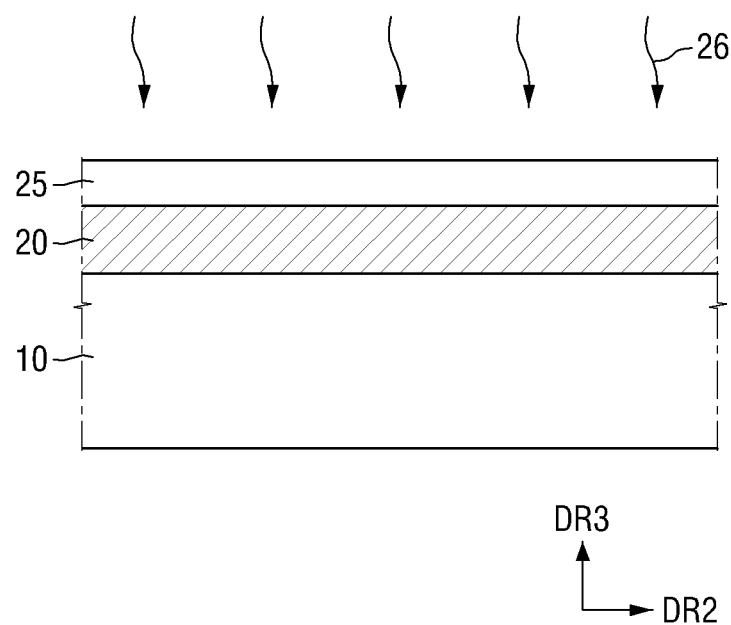

Referring to FIGS. 5 and 6, a buffer layer 20 may be formed on a substrate 10.

Specifically, the buffer layer 20 and an amorphous silicon layer 25 may be formed sequentially on the substrate 10.

After the buffer layer 20 and the amorphous silicon layer 25 are stacked sequentially, an annealing process 26 may be performed on the amorphous silicon layer 25.

The annealing process 26 may include any one of, but not limited to, a laser annealing process or a thermal annealing process.

The annealing process 26 may recrystallize the amorphous silicon layer 25, and the recrystallized amorphous silicon layer 25 may include a monocrystalline silicon layer or a polysilicon layer.

Figure 7:
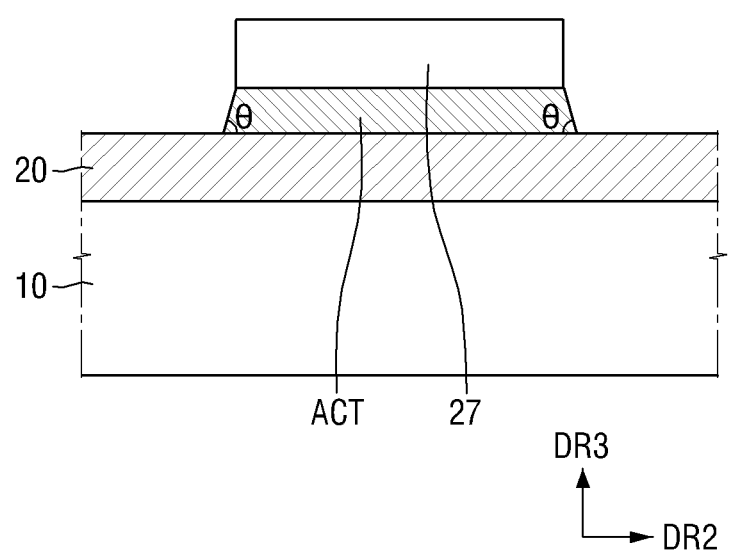

Referring to FIG. 7, an active layer ACT may be formed by patterning the recrystallized the amorphous silicon layer 25.

Specifically, a first photoresist pattern 27 may be formed on the recrystallized amorphous silicon layer 25 and the recrystallized amorphous silicon layer 25 may be patterned using the first photoresist pattern 27 as a mask.

The patterning process may change the amorphous silicon layer 25 to the active layer ACT. A taper angle θ formed by each sidewall and a bottom surface of the active layer ACT may include an acute angle. The taper angle θ is an angle formed in the plane defined by the second and third directions DR2 and DR3 and the magnitude of the taper angle A is not limited to an acute angle.

In addition, the active layer ACT may include a polysilicon layer and have a channel region CR, a source region SR, and a drain region DR arranged in the first direction DR1.

Figure 8:
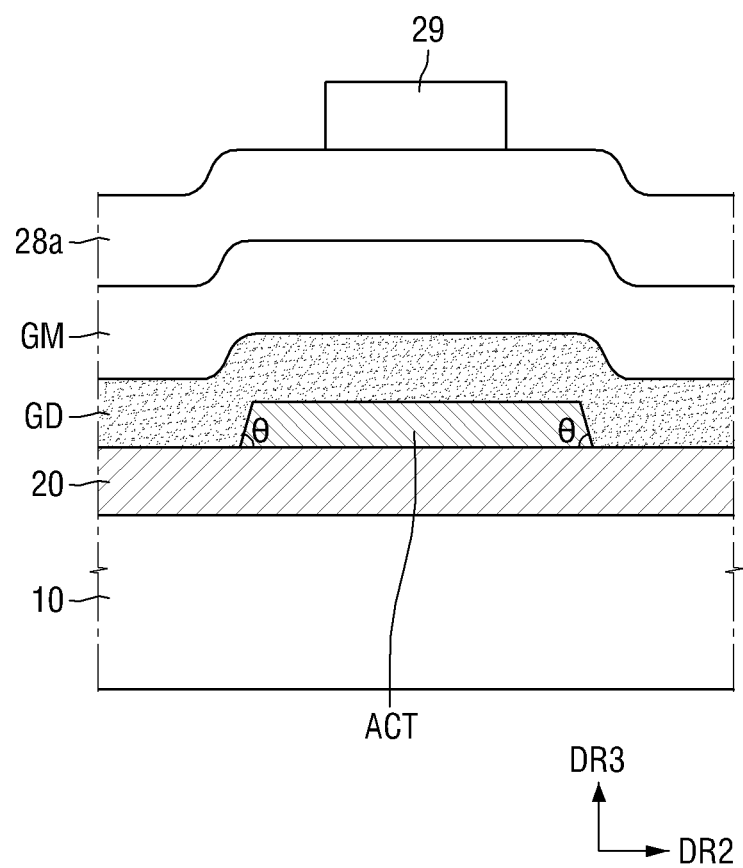
Figure 9:
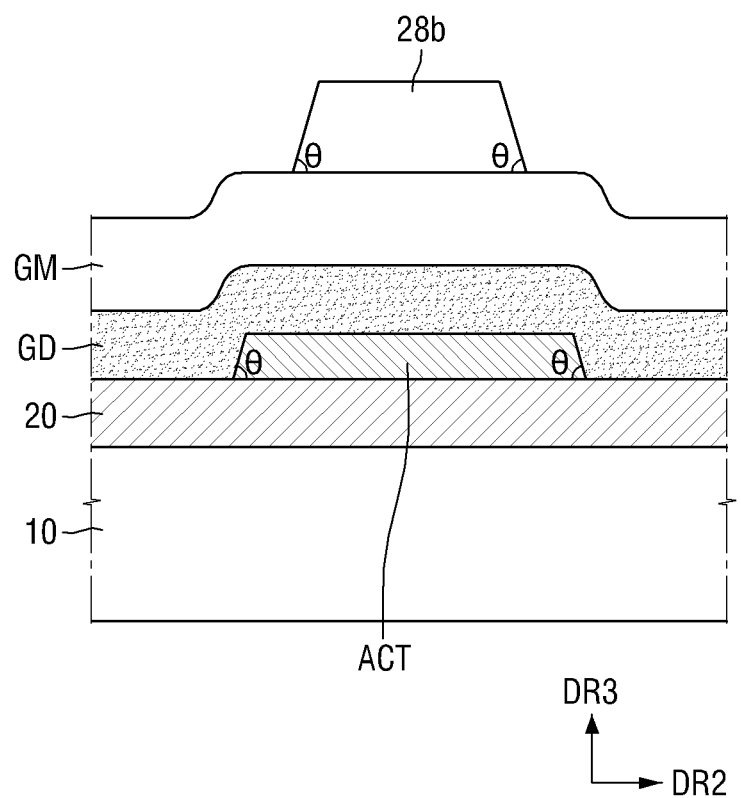

Referring to FIGS. 8 and 9, a gate insulating layer GD, a gate metal layer GM, and a hard mask layer 28a may be stacked sequentially on the active layer ACT.

Specifically, the gate insulating layer GD may be formed on the substrate 10 to completely cover the active layer ACT.

After the gate insulating layer GD, the gate metal layer GM and the hard mask layer 28a are stacked sequentially on the active layer ACT, a hard mask pattern 28b may be formed.

After the hard mask layer 28a is formed on the gate metal layer GM, a second photoresist pattern 29 may be formed on the hard mask layer 28a. After the formation of the second photoresist pattern 29, the hard mask layer 28a may be patterned using the second photoresist pattern 29 as a mask, thereby forming the hard mask pattern 28b.

The hard mask pattern 28b may have a bottom surface and sidewalls that form substantially the same taper angle θ as the angle between the bottom surface and sidewalls of the active layer ACT.

Figure 10:
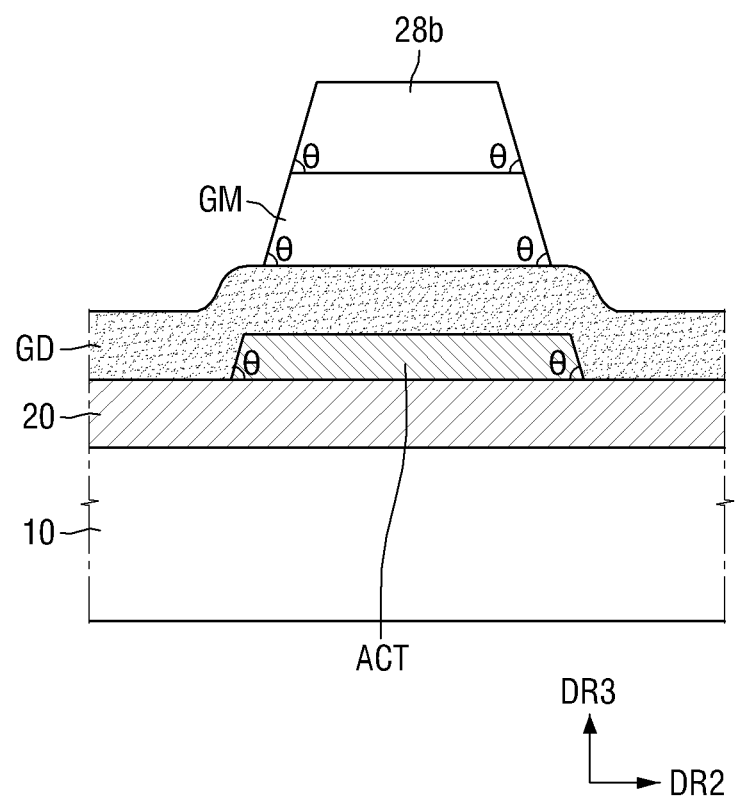

Referring to FIG. 10, the gate metal layer GM may be etched using the hard mask pattern 28b as a mask.

The etched gate metal layer GM may be formed to overlap the active layer ACT. In addition, the etched gate metal layer GM may have a bottom surface and sidewalls that form substantially the same taper angle θ as the bottom surface and sidewalls of the active layer ACT. Depending on the degree to which the gate metal layer GM is etched, the bottom surface and sidewalls of the etched gate metal layer GM may also form a different taper angle θ from the taper angle θ formed by the bottom surface and sidewalls of the active layer ACT.

Figure 11:
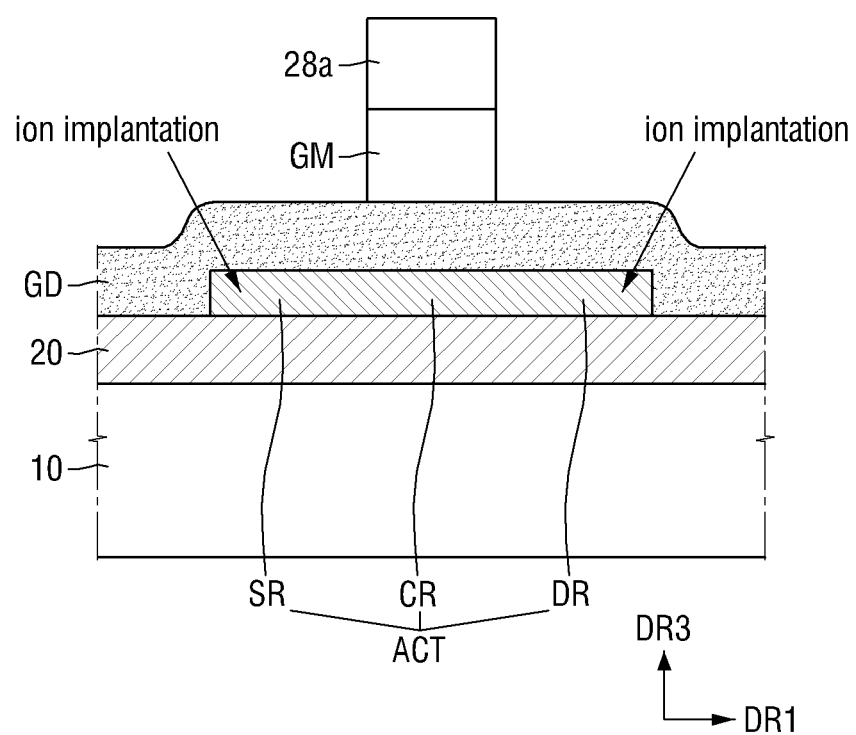
Figure 12:
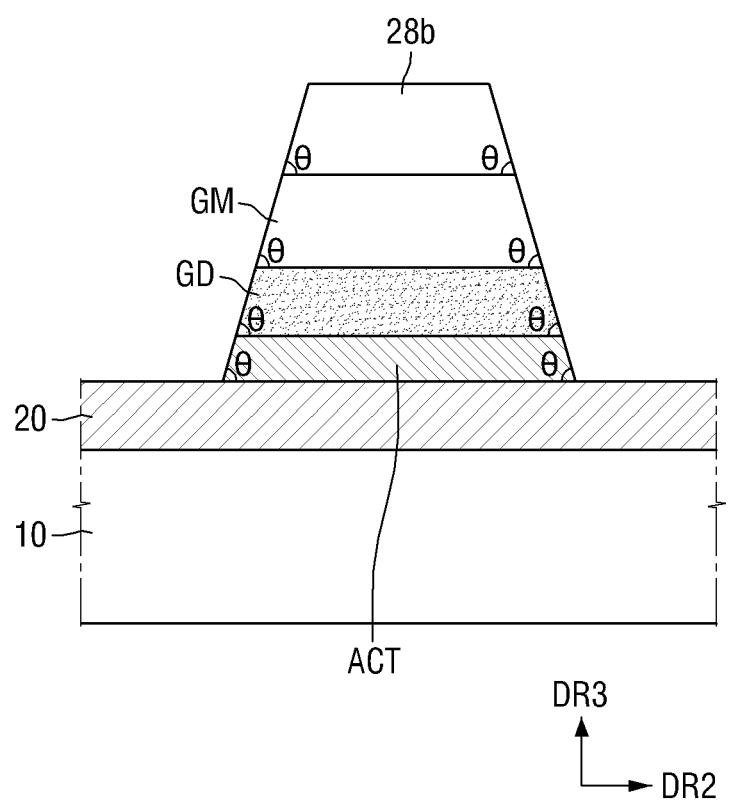

Referring to FIGS. 11 and 12, after the etching of the gate metal layer GM, the source region SR and the drain region DR of the active layer ACT are doped with impurities.

The doping of the source and drain regions SR and DR may include an ion implantation process. Impurities used to dope the source and drain regions SR and DR may be P-type impurities including boron (B), such as $B_2H_6$. The type of impurities used to dope the active layer ACT may vary depending on the embodiment.

After the source and drain regions SR and DR are doped with impurities, the gate insulating layer GD may be etched using the hard mask pattern 28b as a mask.

The etched gate insulating layer GD may be formed to overlap the active layer ACT. In addition, the etched gate insulating layer GD may have a bottom surface and sidewalls that form substantially the same taper angle θ as the bottom surface and sidewalls of the active layer ACT, but the described technology is not limited thereto.

When the gate insulating layer GD is finally etched, it can be seen that the active layer ACT, the gate insulating layer GD, the gate metal layer GM, and the hard mask pattern 28b have been integrally etched to have substantially the same taper angle θ in the plane defined by the second and third directions DR2 and DR3. The structure illustrated in FIG. 12 can reduce the effect of an electric field on carriers located in the channel region CR of the active layer ACT.

The hard mask pattern 28b may be removed after the above etching process, but the described technology is not limited thereto.

Figure 13:
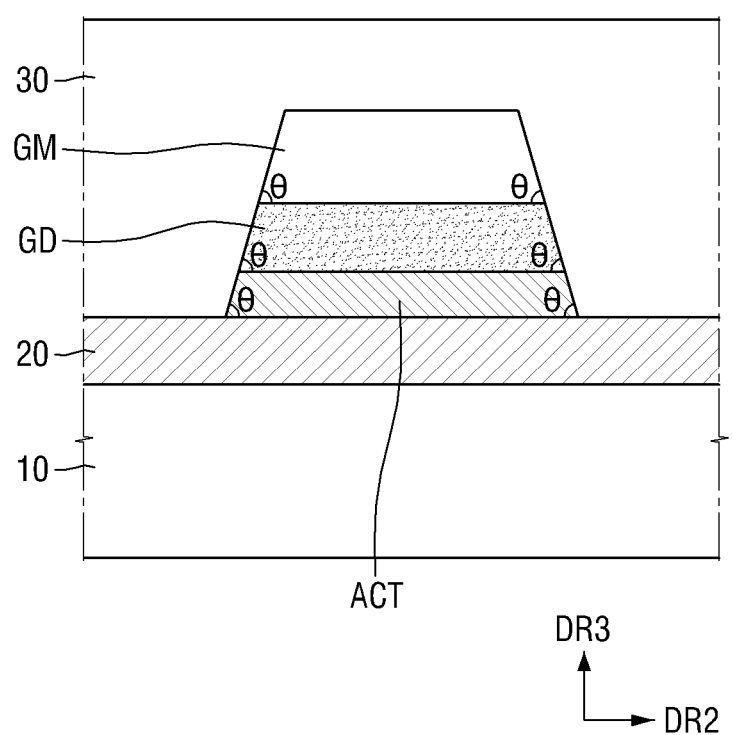

Referring to FIG. 13, after the etching of the gate insulating layer GD, an interlayer insulating layer 30 may be formed on the buffer layer 20, the active layer ACT, the gate insulating layer GD, and the gate metal layer GM.

The dielectric constant of the interlayer insulating layer 30 can be controlled and the interlayer insulating layer 30 is formed to cover both sidewalls of the active layer ACT, both sidewalls of the gate insulating layer GD, and both sidewalls of the gate metal layer GM in the second direction DR2. Accordingly, this can realize constant gate voltage to driving current (Vg-Id) characteristics without hump characteristics despite a structural change in the active layer ACT due to the patterning process of FIG. 7. In addition, a change in the dielectric constant of the interlayer insulating layer 30 results in a change in a fringing field between the gate metal layer GM and the active layer ACT. Therefore, the characteristics of a parasitic transistor can be controlled. Furthermore, by forming the interlayer insulating layer 30, an effect caused by a change in the taper angle θ of the active layer ACT may be decreased.

Figure 14:
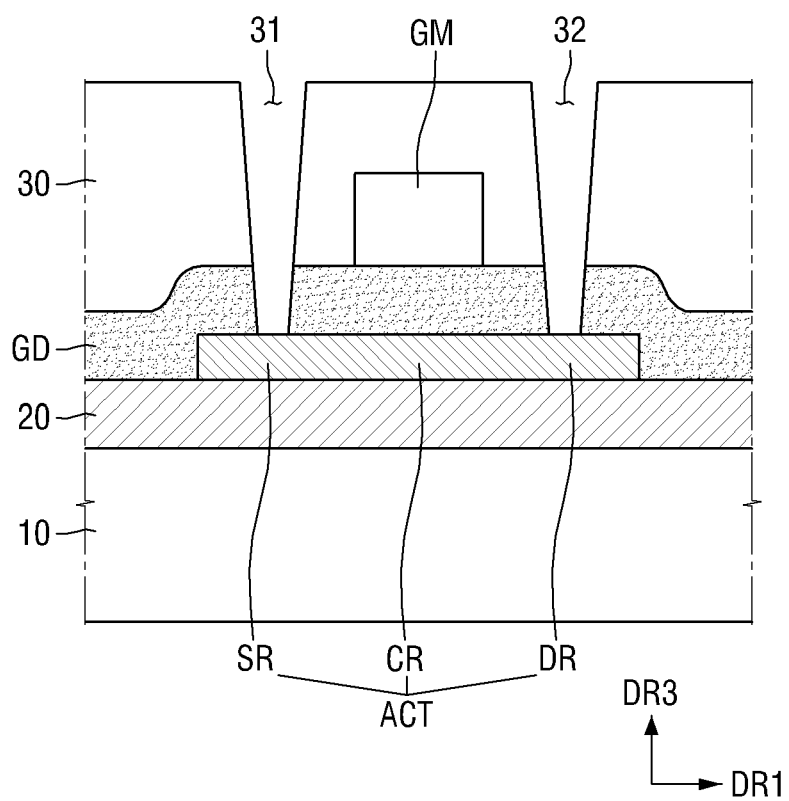
Figure 15:
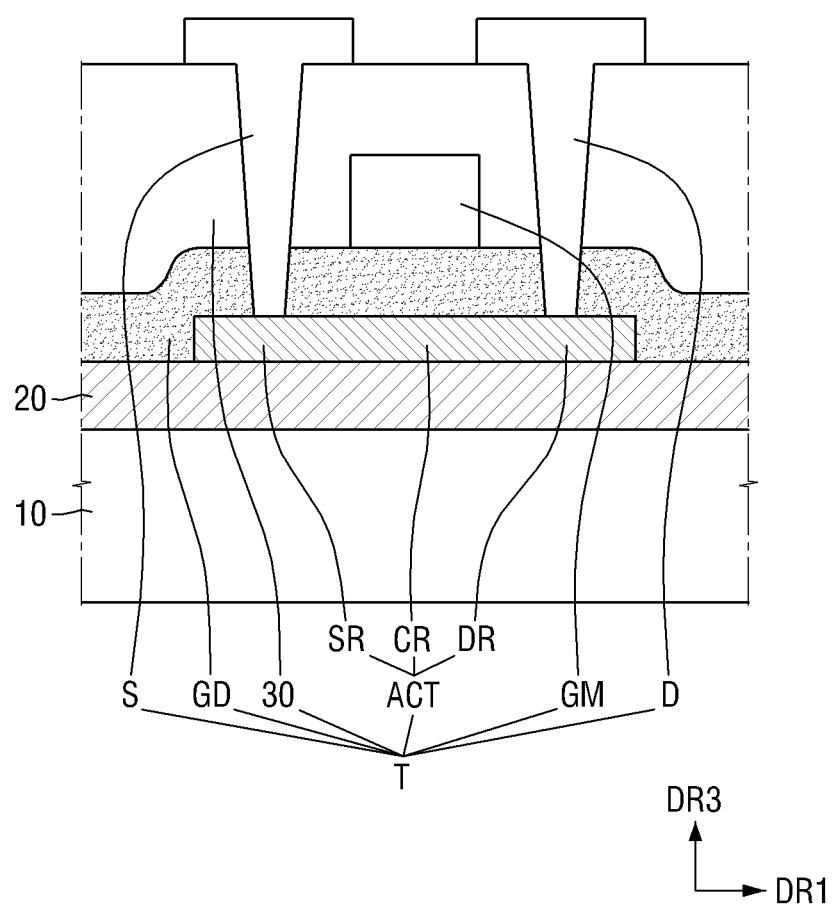

Referring to FIGS. 14 and 15, a first through hole 31 and a second through hole 32 may be formed to be separated from each other in the first direction DR1 and penetrate through the gate insulating layer GD and the interlayer insulating layer 30.

Specifically, the first through hole 31 may be formed over the source region SR of the active layer ACT and the second through hole 32 may be formed over the drain region DR of the active layer ACT.

After the formation of the first and second through holes 31 and 32, a source electrode S and a drain electrode D may be respectively formed in the first and second through holes 31 and 32.

The formation of the source electrode S and the drain electrode D may complete the thin-film transistor T included in the OLED display 1 of FIG. 2.

Figure 16:
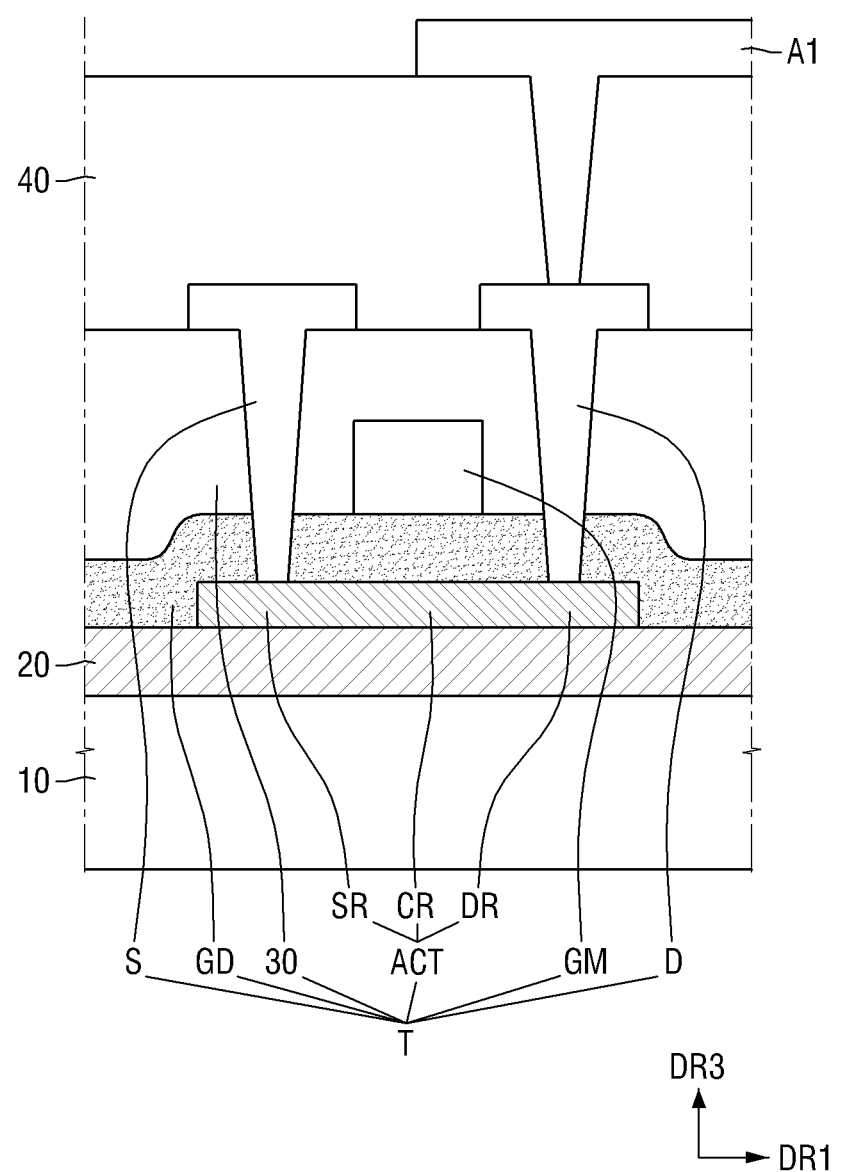
FIGS. 16 and 17 are views illustrating steps of a method of manufacturing an OLED display including the thin-film transistor of FIG. 15.
Figure 17:
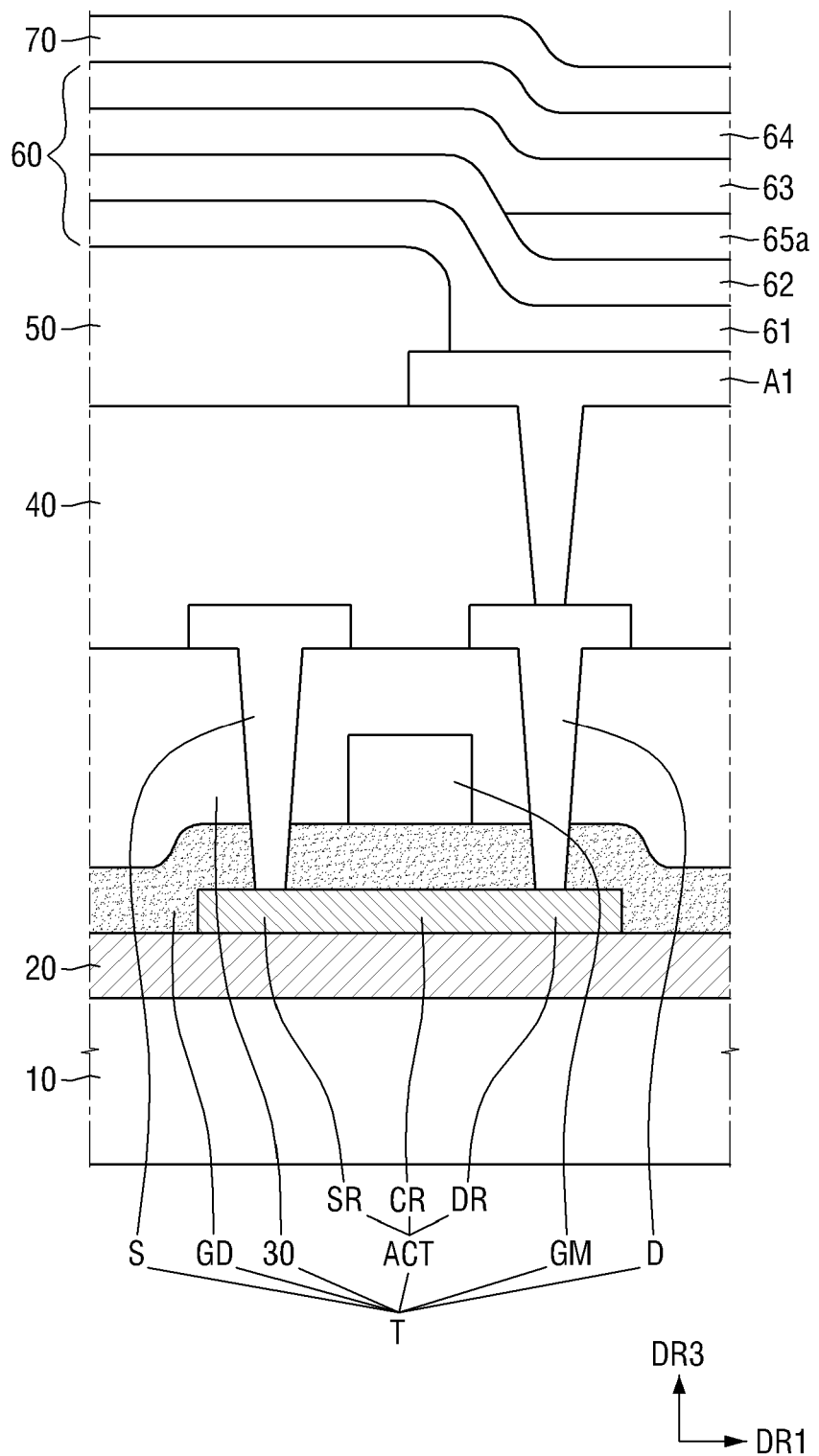

An OLED display including the thin-film transistor T of FIG. 15 will now be described with reference to FIGS. 16 and 17. FIGS. 16 and 17 are views illustrating steps of a method of manufacturing an OLED display including the thin-film transistor T of FIG. 15. The OLED display illustrated in FIGS. 16 and 17 is only a part of the OLED display 1 illustrated in FIG. 2 and a description of this part of the OLED display may also apply to the other parts of the OLED display 1.

Referring to FIG. 16, a first anode A1 may be formed on the substrate 10. The buffer layer 20 and the thin-film transistor T illustrated in FIG. 15 may be formed on the substrate 10. The first anode A1 may be formed on a planarization layer 40. The first anode A1 may be connected to the drain electrode D by a through hole formed in the planarization layer 40.

Referring to FIG. 17, a pixel defining layer 50 may be formed on the substrate 10 and the planarization layer 40.

Specifically, the pixel defining layer 50 may be formed to partially overlap the first anode A1, but the described technology is not limited thereto. The pixel defining layer 50 may expose at least part of a top surface of the first anode electrode A1.

An organic layer 60 may be formed by forming a hole injection layer 61, a hole transport layer 62, a first organic light-emitting layer 65a, an electron transport layer 63, and an electron injection layer 64.

The hole injection layer 61 may be formed on the first anode A1 and the pixel defining layer 50, and the hole transport layer 62 maybe formed on the hole injection layer 61.

The first organic light-emitting layer 65a may be formed on the first anode A1 and the hole transport layer 62. The first organic light-emitting layer 65a may be formed by inkjet printing or deposition using a mask.

The electron transport layer 63 may be formed on the hole transport layer 62 and the first organic light-emitting layer 65a, and the electron injection layer 64 may be formed on the electron transport layer 63.

If the hole injection layer 61, the hole transport layer 62, the electron transport layer 63 or the electron injection layer 64 is omitted from the organic light-emitting display device 1, the process for forming the omitted layer is not performed.

A cathode 70 may be formed on the organic layer 60.

The formation of the cathode 70 on the organic layer 60 may complete the OLED display 1 of FIG. 2.

A method of manufacturing the thin-film transistor T of FIG. 4 will now be described with reference to FIGS. 18 through 22. FIGS. 18 through 22 are views illustrating steps of a method of manufacturing the thin-film transistor T of FIG. 4. The method of manufacturing the thin-film transistor T of FIG. 4 is the same as the method of manufacturing the thin-film transistor T of FIG. 2 in the processes of FIGS. 5 through 10. Therefore, a description of the processes of FIGS. 5 through 10 will be omitted. However, unlike the thin-film transistor T of FIG. 2, the thin-film transistor T of FIG. 4 may be formed such that a gate insulating layer GD covers a channel region CR of an active layer ACT and exposes a source region SR and a drain region DR.

Figure 18:
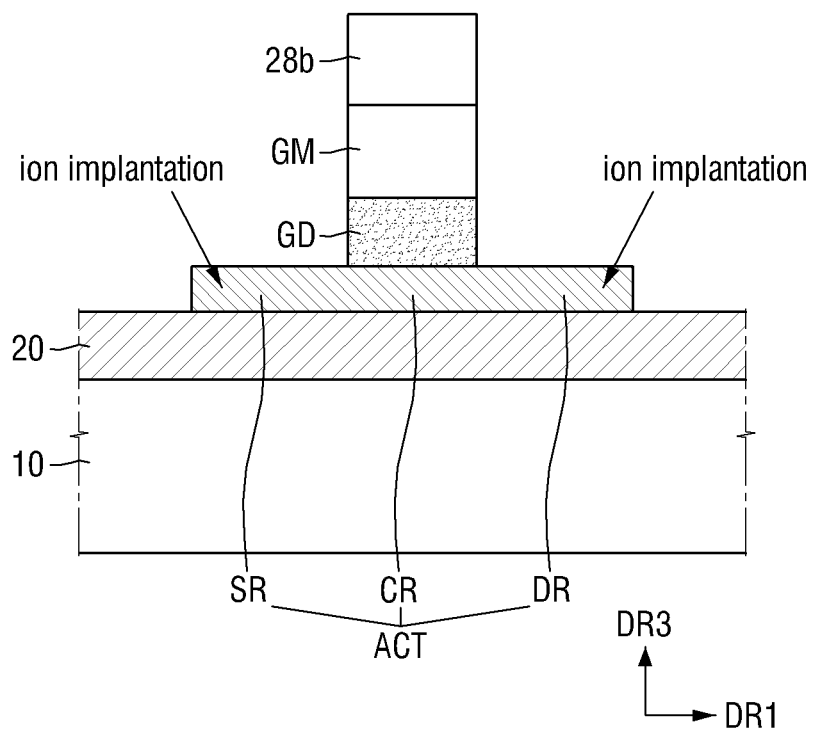
FIGS. 18 through 22 are views illustrating steps of a method of manufacturing the thin-film transistor of FIG. 4.
Figure 19:
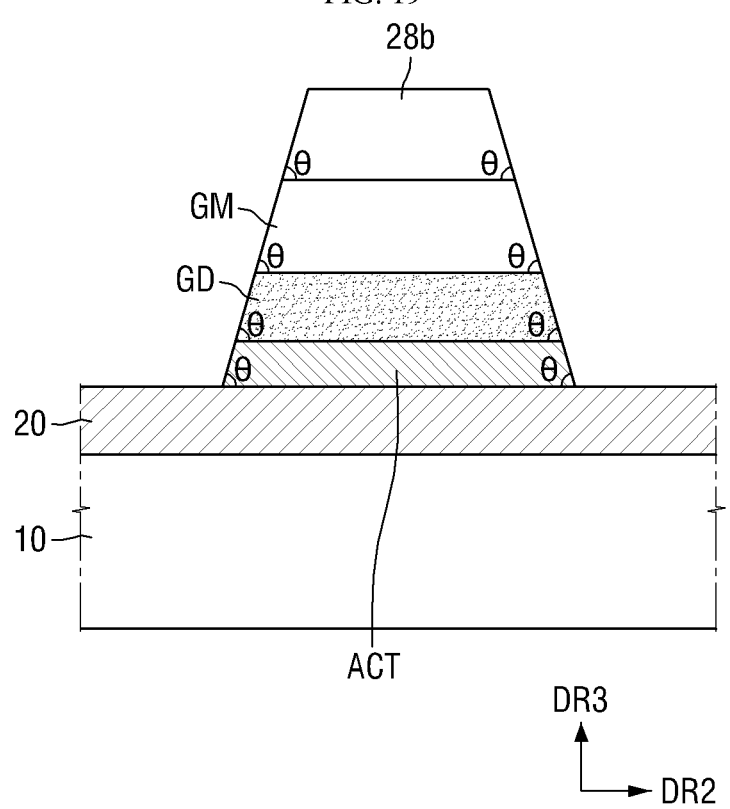
Figure 20:
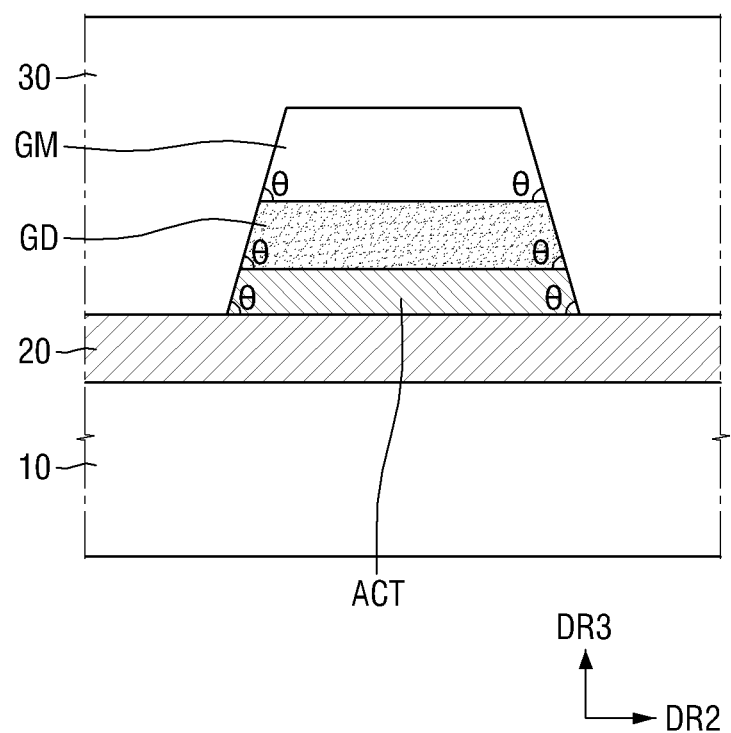
Figure 21:
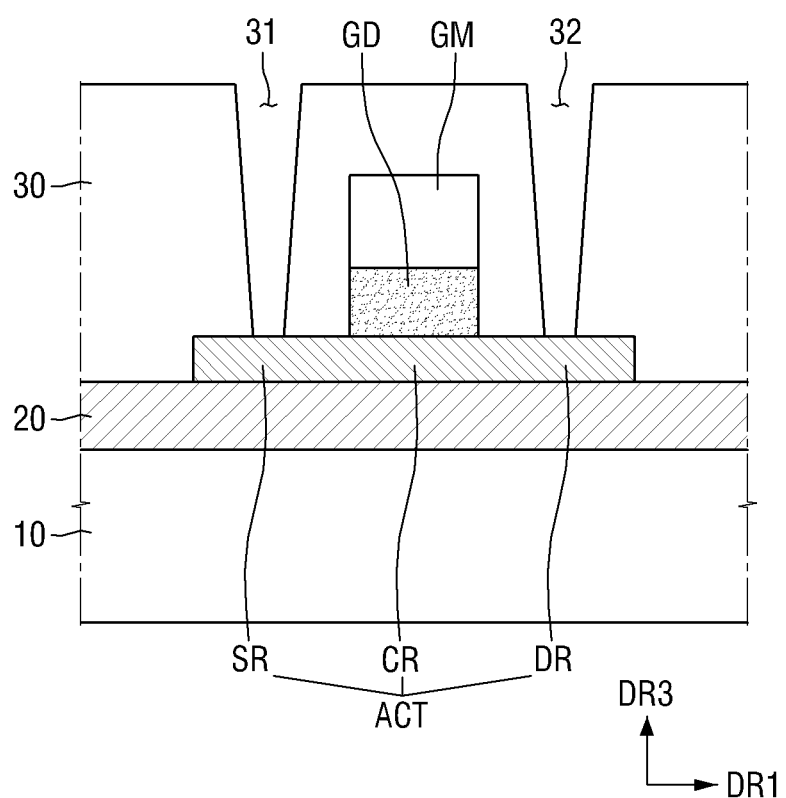
Figure 22:
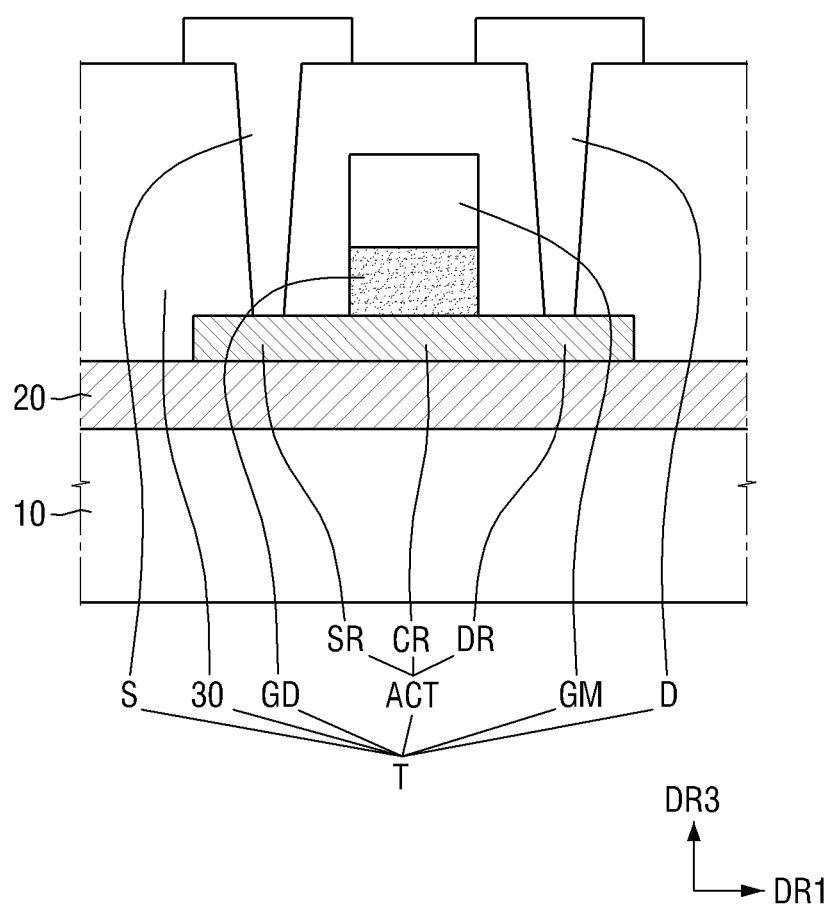
Figure 23:
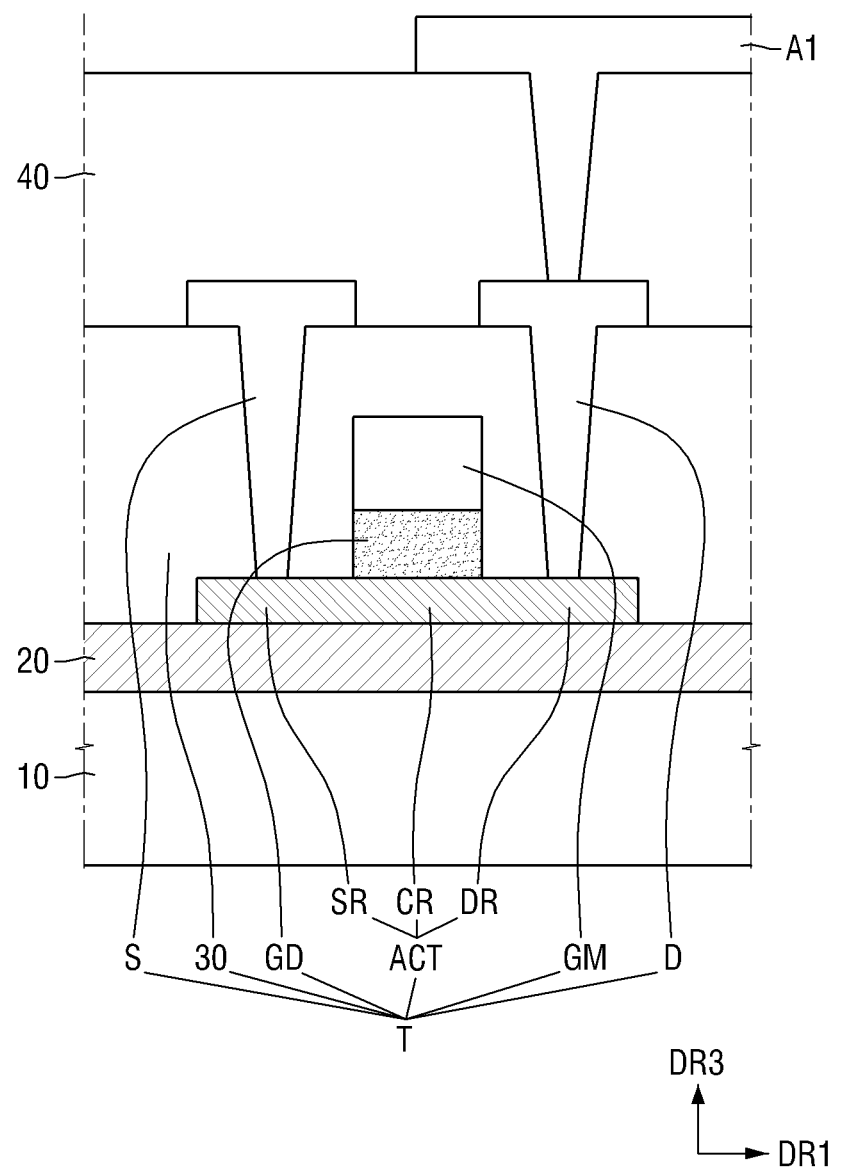
FIGS. 23 and 24 are views illustrating steps of a method of manufacturing an OLED display including the thin-film transistor of FIG. 18.
Figure 24:
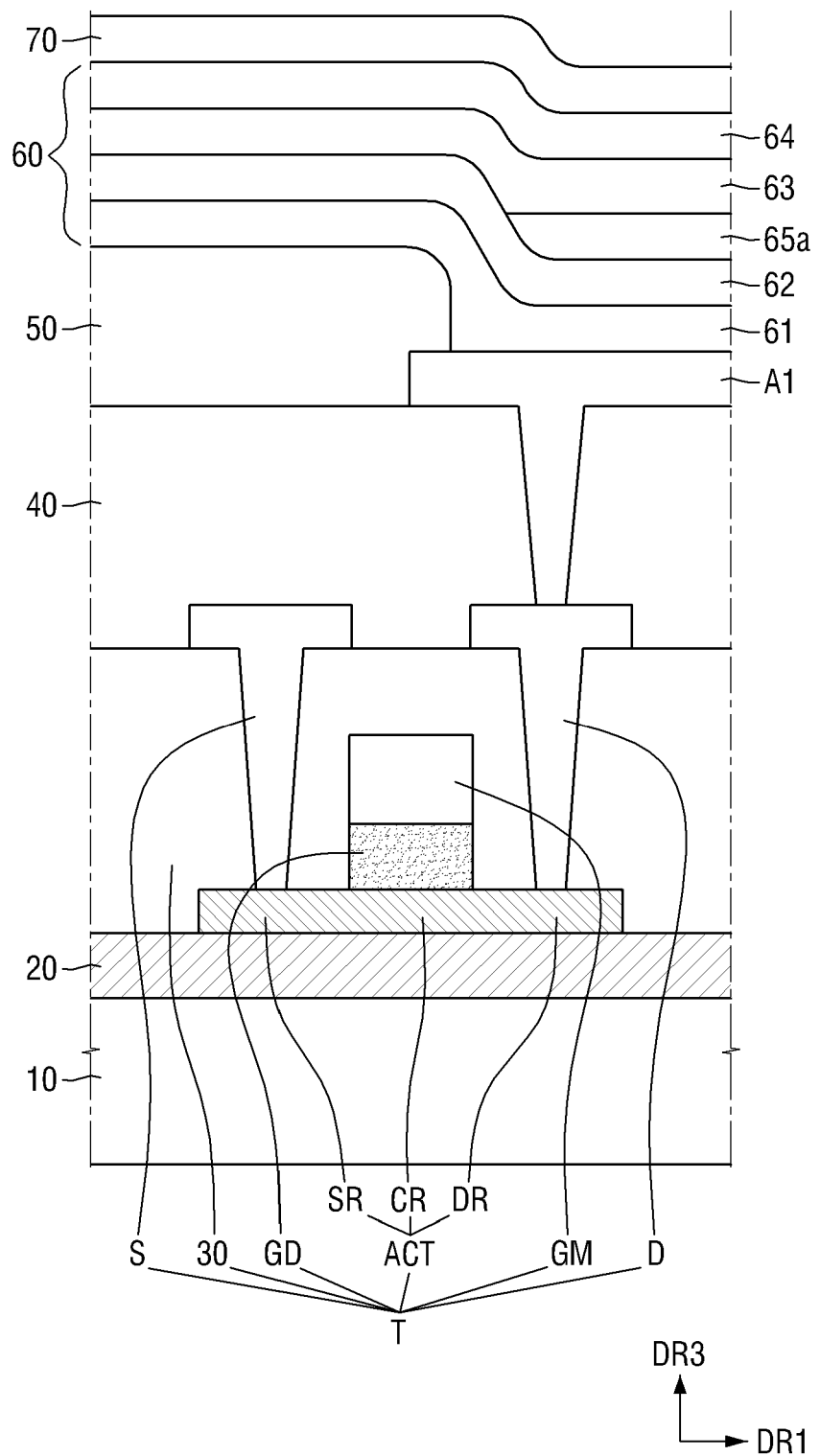

Referring to FIGS. 18 and 19, after the etching of a gate metal layer GM, the source region SR and the drain region DR of the active layer ACT may be doped with impurities.

Specifically, doping the source region SR and the drain region DR with impurities may include an ion implantation process. Impurities used to dope the source region SR and the drain region DR may be P-type impurities including boron (B), such as $B_2H_6$. The type of impurities used to dope the active layer ACT may vary depending on the embodiment.

Unlike the impurity doping process of FIG. 11, in the impurity doping process of FIG. 18, impurities may be injected directly into the source region SR and the drain region DR, not through the gate insulating layer GD.

After the source region SR and the drain region DR are doped with impurities, the gate insulating layer GD may be etched using a hard mask pattern 28b as a mask.

The etched gate insulating layer GD may be formed to overlap the active layer ACT. In addition, the etched gate insulating layer GD may have a bottom surface and sidewalls that form substantially the same taper angle θ as a bottom surface and sidewalls of the active layer ACT, but the described technology is not limited thereto.

If the gate insulating layer GD is finally etched, it can be seen that the active layer ACT, the gate insulating layer GD, the gate metal layer GM, and the hard mask pattern 28b have been integrally etched to have substantially the same taper angle θ in a plane defined by the second and third directions DR2 and DR3. The structure illustrated in FIG. 12 can reduce the effect of an electric field on carriers located in the channel region CR of the active layer ACT.

Here, the hard mask pattern 28b may be removed by an etching process or by a rinse process performed after an etching process. However, the described technology is not limited thereto, and subsequent processes may also be performed without the removal of the hard mask pattern 28b.

Manufacturing processes illustrated in FIGS. 20 through 24 are the same as the above-described manufacturing processes of FIGS. 13 through 17 except that a gate insulating layer GD does not cover a source region SR and a drain region DR, and thus a detailed description thereof is omitted.

At least one embodiment of the described technology provides at least one of the following advantages.

That is, it is possible to minimize the effect of an electric field due to the edge structure of an active layer.

However, the effects of the described technology are not restricted to the one set forth herein. The above and other effects of the described technology will become more apparent to one of ordinary skill in the art to which the described technology pertains by referencing the claims.

While the described technology has been particularly shown and described with reference to exemplary embodiments, it will be understood by those of ordinary skill in the art that various changes in form and details may be made therein without departing from the spirit and scope of the described technology as defined by the following claims. It is therefore desired that the present embodiments be considered in all respects as illustrative and not restrictive, reference being made to the appended claims rather than the foregoing description to indicate the scope of the described technology.

What is claimed is:

1. A thin-film transistor, comprising:
   an active layer including a channel region, a source region, and a drain region arranged in a first direction, wherein the active layer has a top surface having a length in the first direction and a width in a second direction;
   a gate insulating layer formed over the active layer having a bottom surface having a length along the first direction and a width along the second direction; and
   a gate metal layer formed over the gate insulating layer and having a bottom surface,
   wherein the area of the bottom surface of the gate metal layer is less than the area of the top surface of the active layer,
   wherein the bottom surface of the gate metal layer overlaps the top surface of the active layer, and
   wherein the width of the bottom surface of the gate insulating layer is substantially equal to the width of the top surface of the active layer along the second direction.

2. The thin-film transistor of claim 1, further comprising a hard mask pattern formed over the gate metal layer.

3. The thin-film transistor of claim 2, wherein the area of a bottom surface of the hard mask pattern is substantially equal to the area of a top surface of the gate metal layer.

4. The thin-film transistor of claim 1, wherein the gate insulating layer is formed over the channel region and is not formed over the source region and the drain region.

5. The thin-film transistor of claim 1, further comprising an interlayer insulating layer formed over the active layer, the gate insulating layer, and the gate metal layer.

6. The thin-film transistor of claim 5, further comprising first and second through holes defined in the gate insulating layer and the interlayer insulating layer, wherein the first through hole is formed over the source region and wherein the second through hole is formed over the drain region.

7. The thin-film transistor of claim 6, further comprising:
   a source electrode formed in the first through hole; and
   a drain electrode formed in the second through hole.

8. The thin-film transistor of claim 1, wherein a cross-sectional portion of the gate insulating layer overlaps a corresponding cross-sectional portion of the active layer and wherein the width of the gate insulating layer is less than the width of the active layer.

9. The thin-film transistor of claim 1, wherein the active layer is formed at least partially of a polysilicon material.

10. The thin-film transistor of claim 1, wherein the bottom surface of the gate metal layer has a width along the second direction, the gate insulating layer has a top surface having a width along the second direction, and the width of the top surface of the gate insulating layer is substantially equal to the width of the bottom surface of the gate metal layer.

11. The thin-film transistor of claim 1, wherein the active layer includes a first thickness along a third direction, the gate insulating layer includes a second thickness along the third direction, and the gate metal layer includes a third thickness along the third direction, and wherein the third thickness is greater than the second thickness and the second thickness is greater than the first thickness.

12. The thin-film transistor of claim 1, wherein the active layer includes a bottom surface, and each of the active layer, gate insulating layer, and gate metal layer includes sidewalls defining a taper angle therebetween and wherein the taper angles of each of the active layer, the gate insulating layer, and the gate metal layer are substantially equal.

13. The thin-film transistor of claim 12 wherein the taper angles of each of the active layer, the gate insulating layer, and the gate metal layer are equal.

14. An organic light-emitting diode (OLED) display, comprising:
   a substrate;
   a plurality of OLEDs formed over the substrate; and
   a plurality of thin-film transistors formed over the substrate and respectively connected to the OLEDs,
   wherein each of the thin-film transistors comprises:
      an active layer formed over the substrate and having a top surface having a length in a first direction and a width in a second direction;
      a gate insulating layer formed over the active layer having a bottom surface having a length along the first direction and a width along the second direction; and
      a gate electrode formed over the gate insulating layer and having a bottom surface,
      wherein the width of the gate electrode is less than that of the active layer,
      wherein the bottom surface of the gate electrode overlaps the top surface of the active layer, and
      wherein the width of the bottom surface of the gate insulating layer is substantially equal to the width of the top surface of the active layer along the second direction.

15. The OLED display of claim 14, wherein each of the active layer, the gate insulating layer, and the gate electrode includes a bottom surface and sidewalls defining a taper angle therebetween and wherein the taper angles of each of the active layer, the gate insulating layer, and the gate electrode are substantially equal.

16. The OLED display of claim 15, wherein the taper angles of each of the active layer, the gate insulating layer, and the gate electrode are acute angles.

17. The OLED display of claim 15, wherein the sidewalls of each of the active layer, the gate insulating layer, and the gate electrode are substantially parallel.

18. The OLED display of claim 15, wherein the sidewalls of each of the active layer, the gate insulating layer, and the gate electrode are equal.

* * * * *